(12) United States Patent
Muona et al.

(10) Patent No.: US 11,644,292 B2
(45) Date of Patent: May 9, 2023

(54) APPARATUS, METHOD AND COMPUTER PROGRAM PRODUCT FOR DESIGNING BLASTING ORDER

(71) Applicant: SANDVIK MINING AND CONSTRUCTION OY, Tampere (FI)

(72) Inventors: Juoko Muona, Tampere (FI); Juha-Matti Myllyla, Tampere (FI)

(73) Assignee: Sandvik Mining and Construction Oy, Tampere (FI)

( * ) Notice: Subject to any disclaimer, the term of this patent is extended or adjusted under 35 U.S.C. 154(b) by 142 days.

(21) Appl. No.: 17/426,347

(22) PCT Filed: Jan. 21, 2020

(86) PCT No.: PCT/EP2020/051341
§ 371 (c)(1),
(2) Date: Jul. 28, 2021

(87) PCT Pub. No.: WO2020/156872
PCT Pub. Date: Aug. 6, 2020

(65) Prior Publication Data
US 2022/0099424 A1  Mar. 31, 2022

(30) Foreign Application Priority Data
Feb. 1, 2019 (EP) .................................. 19155032

(51) Int. Cl.
| F42D 3/04 | (2006.01) |
| G06F 30/20 | (2020.01) |
| E21B 7/02 | (2006.01) |
| E21D 9/00 | (2006.01) |
| F42D 1/055 | (2006.01) |

(52) U.S. Cl.
CPC ................ F42D 3/04 (2013.01); E21B 7/025 (2013.01); E21D 9/006 (2013.01); F42D 1/055 (2013.01); G06F 30/20 (2020.01)

(58) Field of Classification Search
CPC . F42D 3/04; F42D 1/055; E21B 7/025; E21D 9/006; G06F 30/20; G06F 30/00
USPC ........ 102/312, 301, 302, 313; 175/2, 24, 57, 175/4.55–4.59; 89/1.15; 702/11
See application file for complete search history.

(56) References Cited

U.S. PATENT DOCUMENTS

| 4,192,554 A * | 3/1980 | Ricketts ................. E21C 41/24 |
| | | 102/314 |
| 4,194,789 A * | 3/1980 | Studebaker ............. E21C 41/24 |
| | | 102/314 |

(Continued)

FOREIGN PATENT DOCUMENTS

| EP | 0897098 A2 | 2/1999 |
| KR | 101815926 B1 | 1/2018 |

*Primary Examiner* — Michael D David
(74) *Attorney, Agent, or Firm* — Corinne R. Gorski

(57) ABSTRACT

An apparatus and method for designing a blasting sequence for a drilling pattern of a round. The apparatus (11) is configured to assist selecting one or more drill holes (3) for each time delay of the blast. The apparatus calculates burst volume ($V_B$) for the selected drill hole set (34) and ensures that previously blasted free volume ($V_F$) can receive it when being fired. The apparatus may also take into account burst angles burst distances and ground vibrations when suggesting the drill hole sets.

16 Claims, 6 Drawing Sheets

(56) References Cited

U.S. PATENT DOCUMENTS

| | | | | |
|---|---|---|---|---|
| 4,210,366 | A * | 7/1980 | Hutchins | E21B 43/248 299/13 |
| 4,262,965 | A * | 4/1981 | Ricketts | E21C 41/24 299/13 |
| 4,346,935 | A * | 8/1982 | Huijnen | E21B 43/248 299/13 |
| 4,402,550 | A * | 9/1983 | Ricketts | E21B 43/305 299/13 |
| 5,388,521 | A * | 2/1995 | Coursen | F42D 1/055 102/311 |
| 6,330,860 | B1 * | 12/2001 | Kang | F42D 1/00 102/312 |
| 8,256,349 | B2 * | 9/2012 | Moore | F42D 1/055 102/312 |
| 8,261,664 | B2 * | 9/2012 | Von Lengeling | F42D 1/10 102/311 |
| 8,395,878 | B2 * | 3/2013 | Stewart | F42D 3/04 361/247 |
| 9,587,925 | B2 * | 3/2017 | Garcia | F42D 1/055 |
| 10,837,750 | B2 * | 11/2020 | Averett | F42D 3/04 |
| 2005/0263027 | A1 | 12/2005 | Johnston et al. | |
| 2016/0069655 | A1 * | 3/2016 | Brent | F42D 3/04 102/312 |
| 2017/0074625 | A1 * | 3/2017 | Appleby | F42D 1/055 |
| 2021/0102793 | A1 * | 4/2021 | Pereira | F42D 1/08 |
| 2021/0365608 | A1 * | 11/2021 | Preece | G06F 30/20 |

\* cited by examiner

APPARATUS, METHOD AND COMPUTER PROGRAM PRODUCT FOR DESIGNING BLASTING ORDER

RELATED APPLICATION DATA

This application is a § 371 National Stage Application of PCT International Application No. PCT/EP2020/051341 filed Jan. 21, 2020 claiming priority to EP 19155032.6 filed Feb. 1, 2019.

BACKGROUND OF THE INVENTION

The invention relates to an apparatus comprising at least one data processing device for designing blasting order of drill holes of a drilling pattern of a round.

The invention further relates to a method of designing blasting order of drill holes of a round, and also to a computer program product for executing the disclosed method and solution.

Underground tunnels are excavated in rounds. Several successive rounds produce the tunnel having a tunnel face. At first drill holes are drilled to a face surface, where after the drilled holes are charged and blasted. Quality and efficiency of the blast depends on many things, such as feasibility of the used drilling pattern, accuracy of the executed drilling and success of a charging plan defining amount of the charges and timing sequence of the blast. Firing order and timing of the drilled holes have significant influence on succeed of the blast. The blasting plans are typically designed manually. However, the manual design work and the manually designed blasting plans have shown to contain some disadvantages.

BRIEF DESCRIPTION OF THE INVENTION

An object of the invention is to provide a novel and improved apparatus, method and computer program product for designing blasting order of drill holes of a round.

An idea of the disclosed solution is that an apparatus is configured to design blasting order of drill holes of a face drilling pattern of a round. The apparatus comprises one or more data processing devices for executing the designing measures. A face of the round defines a first free surface for the blasting and the apparatus is provided with data on drill holes and available time delays of the blast. The apparatus designs a blasting sequence for the drilling pattern by dividing the blast into several successive time delays following an initial blasting of cut charges creating an initial second free surface for the blast. Thus, the blast has two free surfaces, the first and second free surfaces. The apparatus may select one or more drill holes for each greater time delay wherein the drill holes are surrounding previously formed second free surface defined by drill holes having shorter time delay than the examined time delay. The selected drill holes form a drill hole set for the time delay. The apparatus determines burst volumes for each subsequent time delay based on input data on the selected drill hole set and data on the expanding second free surface. The apparatus also determines free volume for each subsequent time delay, wherein the free volume is defined by the expanding second free surface and length of the round. Further, the apparatus determines swollen burst volumes by multiplying the determined burst volumes with an input swell factor and compares the swollen burst volumes with the determined free volumes. The apparatus only allows selection of drill hole sets where the swollen burst volumes are minor than the calculated free volumes.

An advantage of the disclosed solution is that the properly designed blasting sequence ensures that the rock material to be blasted at each time delay has enough space to expand. When the rock material is blasted, it requires more space than before the blasting. In other words, the blasting causes the rock material to swell and greater space is always required to receive the swollen volume. The disclosed solution takes into account this phenomenon and may thereby prevent blasting failures caused by unfavorable blasting order of the drill holes. By means of the disclosed properly designed drilling sequence quality of the blasting is improved. The blasts are not blocked when the blasted and fragmented rock material may move towards the neighboring free space, and further, at least part of the blasted loose rock material may also flow fluently out of the free space due to the explosion. All this may be achieved when the blasted material has enough space to expand. In other words, blocking tendency may be reduced and laborious and time consuming re-drilling, re-charging and re-blasting may be avoided. The rounds may be blasted in one go and no expensive corrective measures are required. And still, the blasting sequence can be designed to fulfill required other quality and effectiveness requirements.

According to an embodiment, the apparatus is configured to determine the swollen burst volumes by multiplying the determined burst volumes with an input swell factor SF, which is greater than 1.0. The value of the swell factor depends on how big rock material blocks are formed during the blasting. The greater the blocks the larger the volume is needed and vice versa. The size of the blocks may depend on quality and type of the rock material and also on implemented blasting techniques and principles. Further, when two rock volumes are blasted simultaneously on opposite sides of the free volume, then the blasted rock material collides and the blocks break into several minor pieces. This way the block size may also depend on the used blasting technique.

According to an embodiment, magnitude of the swell factor input to the apparatus is 1.6, or in some cases even greater. This means that the free volume needs to be at least 60% greater than the burst volume. The value 1.6 is determined empirically.

According to an embodiment, the swell factor is adaptable by an operator. Then the apparatus may provide the operator with a possibility to freely select values for the swell factor which are greater than 1.0.

According to an embodiment, the apparatus is configured to examine burst angles of the unblasted holes and takes them into account when selecting drill holes. Thus, the apparatus determines burst angles for the drill holes surrounding the second free surface. The apparatus compares the detected burst angles with input minimum allowable burst angle and allows only selection of drill holes having magnitude of the burst angle greater than the minimum burst angle towards the second free surface. When the burst angle opens wide enough, then the blasted material moves properly towards the free volume. However, when too narrow burst angles are used, the blast may block and cause laborious and time consuming extra work and may even ruin the entire round.

Let it be mentioned that in this document the term burst angle is used. However, the burst angle can also be called an eruption angle or a blasting angle. The same applies also for the term burst volume, which may be also be called as an eruption volume or a blasting volume.

According to an embodiment, the apparatus is configured to allow only selection of drill holes having magnitude of the burst angle at least 55° towards the second free surface. In practice it has been noted that 55° is suitable burst angle value for most situations.

According to an embodiment, the operator of the apparatus is allowed to adjust magnitude of the blasting angle towards the second free surface. The apparatus may offer a predetermined range for the selection.

According to an embodiment, the apparatus aims to select maximum amount of drill holes for each detonator time delay because number of time delays is limited. Typically the number of time limits is about 30 and the number of drill holes may be over 200. Thereby, each time delay after few initial time delays around a cut needs to include several drill holes, or otherwise the time delays run out.

According to an embodiment, the apparatus is further configured to determine perpendicular distances defining burst distances Bd between the outermost drill holes of allowable alternative at least two drill hole sets and the second free surface. The apparatus prioritizes one drill hole set having the shortest distance. The burst distance may alternatively be called the shortest distance.

According to an embodiment, the apparatus is further configured to maximize momentary total amount of explosive material for the used time delays. Then data on charges of the drill holes and data on maximum momentary total amount of explosive material allowed to be blasted at the time delays are input to the apparatus. The apparatus calculates total amount of explosive material of the selected drill holes of the examined time delay and may limit the selection of the drill holes so that the total amount of explosive material of the drill holes is below the allowed momentary total amount of explosive material. This way, the blasting may be executed effectively since as great amount of explosive material as possible is blasted at each time delay, and still, generation of oversized harmful vibrations are avoided when the set maximum values are not exceeded.

Let it be further mentioned that the generated vibration of the blast depends on the mass of the explosives that are blasted at one particular time. This amount is called momentary mass. This amount is calculated by the apparatus and number of same time detonated holes are restricted to be below the set maximum momentary mass.

According to an embodiment, when the apparatus notifies that the maximum amount of explosive material is not close for the examined time delay, then the apparatus may suggest to select, or may automatically select, maximum amount of drill holes for the time delay still without exceeding the allowed momentary total amount of explosive material. This way efficient blast is achieved without exceeding set ground vibration limits.

According to an embodiment, the apparatus is configured to automatically define following longer time delay for additional manually selected drill holes when causing exceed of the allowed momentary total amount of explosive material.

According to an embodiment, the operator may select manually one or more drill holes for desired time delay. The apparatus may take over the planning measures after the manual selections have been terminated and may continue the planning by fulfilling the selection of drill holes. This embodiment allows an experienced operator to make desired selections, and after being done, the apparatus may continue the automated planning mode until designing work of the blasting sequence is finished, or until the manual mode is implemented again.

According to an embodiment, the planning work of the blasting sequence is executed in computer aided manner. Then the apparatus operates in co-operation with the operator and may provide the operator with proposals of the selected drill holes for each time delay. The apparatus may generate the suggestions automatically but requests acceptance from the operator for the suggested previous time delay before initiating planning subsequent time delay. The operator needs only to monitor the planning work and to acknowledge the suggested designs steps. Thereby the operator is all the time aware of the situation, which is important since the operator is responsible for the end result. However, the apparatus provides valuable assistance for the operator thereby quickening and facilitating the design work.

According to an embodiment, the apparatus is configured to operate in a computer assisted manner in cooperation with an operator. The apparatus may assist an operator for selecting suitable drill holes for the time delays. However, in this embodiment the operator creates the end result.

According to an embodiment, the apparatus is configured to take into account manual selection of one or more drill holes input by the operator, and is configured use the input selection as a base selection for the examined time delay. Then the operator may select manually drill holes for the examined time delay and the computer aided operation of the apparatus may continue in response to receiving control command to continue. Thus, the apparatus prioritizes the manual selections and adapts to the made selections.

According to an embodiment, the apparatus is configured to orientate selection of drill holes of subsequent time delay relative to the already formed free second surface based on input manual selection of the operator.

According to an embodiment, the apparatus is configured to examine the blasting sequence on the first free surface, i.e. on the face of the round.

According to an embodiment, the apparatus is configured to examine the blasting sequence at the bottom of the round, i.e. at a plane defined by the bottoms of the drill holes.

According to an embodiment, the apparatus is configured to examine the blasting sequence three dimensionally (3D).

According to an embodiment, the blasting sequence comprises a limited number of time delays. The number of the time limits is limited by the available number of non-electronic detonators with different delays. Typically the number of available different time delays is 30-40. Since the number of time delays is limited, the apparatus may be arranged to select as many drill holes as possible for each time delay so that the drilling pattern with a great number of drill holes can be managed. However, when selecting the number of drill holes to be blasted simultaneously at the same time delay, generated vibrations and amount blasted explosive material needs to be taken into consideration. Thereby, the selection of drill holes is a kind of optimization problem, and the apparatus aims to solve that problem, typically in co-operation with the operator.

According to an embodiment, the blasting sequence is designed for electronic detonators. Then the number of available different time delays may be greater than when using non-electronic detonators. The apparatus may be configured to adjust number of used time delays of the electronic detonators, and may also be configured to adjust time intervals between the subsequently fired detonators.

According to an embodiment, the apparatus comprises at least one display device and is configured to visualize on a display device the generated blasting sequence step by step by presenting the burst volumes at each time delay. As an alternative, the display device may display areas of the burst volumes two-dimensionally on the face of the round or at the bottom of the round. Thanks to the visualization it is easier for the operator to monitor the planning work. An overall understanding of the situation is improved and it is also easier for the operator to validate the planned sequence. Further, the visualization may also be used for the training purposes.

According to an embodiment, the created blasting sequence is presented or animated on the display device, whereby the result of the planning work can be shown in an illustrative and intuitive manner.

According to an embodiment, the apparatus comprises at least one display device and is configured to display the drilling pattern together with the selectable drill holes on the display device. The display device may display at the examined time delay previous second free surface defined by drill holes having shorter time delay compared to the examined time delay. The system may also indicate the selected drill holes of the examined time delay relative to the previous second free surface, and may indicate expansion of the second free space caused by the selected drill holes of the examined time delay.

According to an embodiment, the apparatus determines the same time delays or firing number for two separate sets of drill holes locating on opposite sides of the second free surface. Then the two opposing drill hole sets are blasted simultaneously and the removing rock material will collide during the blast and will thereby become crushed when colliding. An advantage of this embodiment is that blocking of the blast can be avoided when no big sized rock blocks are created. Crushed rock material may move fluently away from the created free space of the round.

According to an embodiment, the blasting sequence may have special initial steps at the beginning of the blast. The apparatus may select only single drill holes for a predetermined amount of first time delays. This way it is ensured that adequate free volume is created for the blasted rock material at the beginning of the blast. The number of such single hole time delays is selectable by the operator.

According to an embodiment, the apparatus is configured to take into account set maximum amount for simultaneously fired explosive material. Thereby strict environmental limits on ground vibration set by authorities may also be fulfilled in sensitive sections without the need to utilize unnecessary restrictions to blasting operations. The disclosed solution may also allow use of the drilling and blasting method at work sites, which are previously excavated by means of other methods because of extremely strict ground vibration limits. All in all, quality and efficiency of the blasting may be improved and advance of the tunnel may be ensured.

According to an embodiment, the apparatus is provided with at least one designing algorithm or computer program for allowing the apparatus to execute the disclosed design steps and process. Thus, a semi-automated or possibly a fully automated blasting sequence design process is provided.

The above disclosed embodiments can be combined in order to form suitable solutions provided with necessary features.

BRIEF DESCRIPTION OF THE FIGURES

Some embodiments are described in more detail in the accompanying drawings, in which.

For the sake of clarity, the figures show some embodiments of the disclosed solution in a simplified manner. In the figures, like reference numerals identify like elements.

DETAILED DESCRIPTION OF SOME EMBODIMENTS

Figure 1:
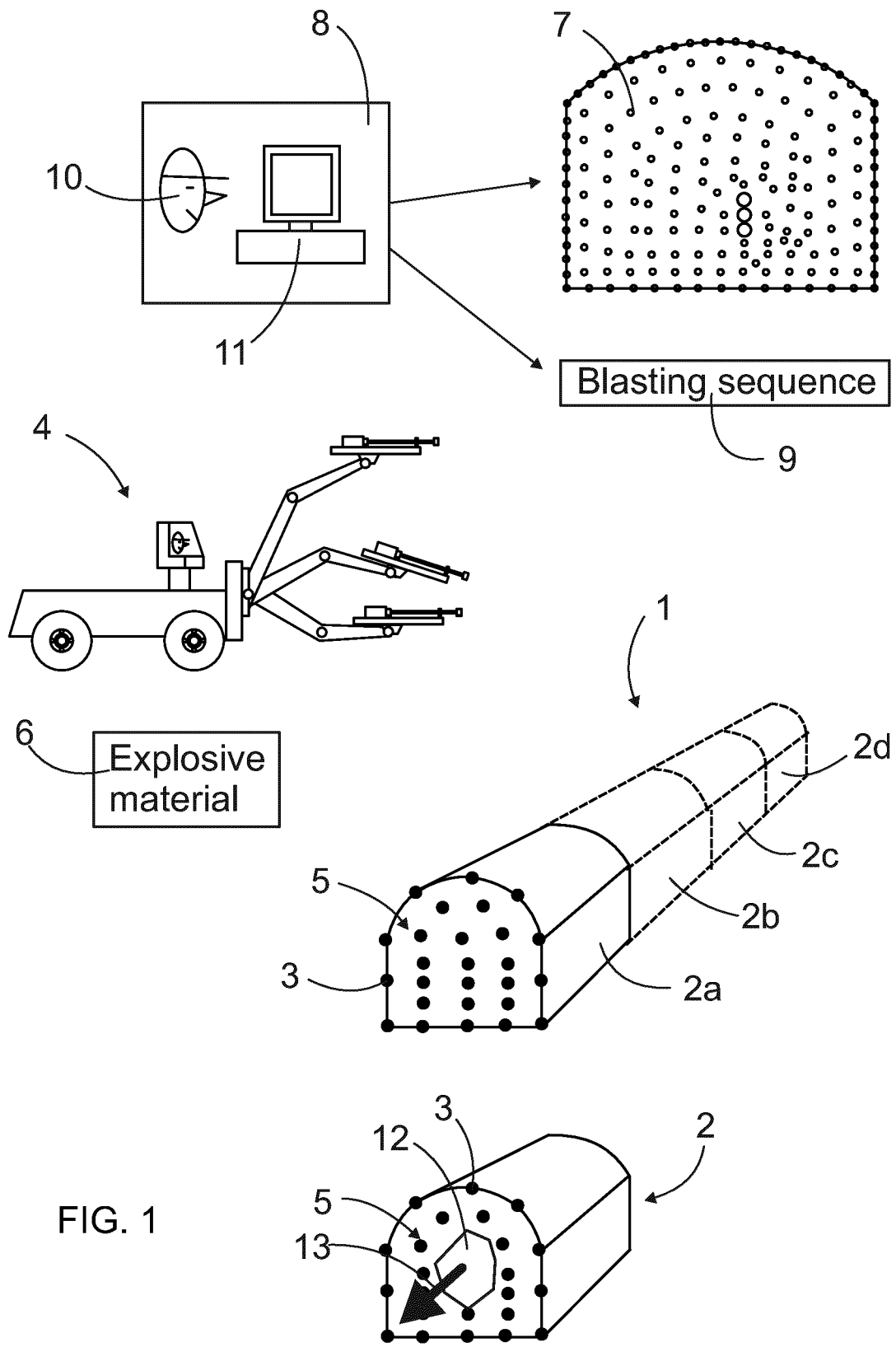
FIG. 1 is a schematic view showing some basic issues relating to tunnel excavation utilizing the drilling and blasting method.

FIG. 1 shows features relating to the disclosed system of excavating underground tunnels 1 in several successive rounds 2a-2d. Drill holes 3 are drilled by means of a rock drilling rig 4 on a face surface 5 of the tunnel 1. After the drilling the drill holes 3 are charged with blasting material or explosives 6. For the drilling work drilling patterns are 7 designed typically at office 8, as well as charging plans, such as blasting sequences 9. The design work may be executed in a computer aided manner. In other words, an operator 10 may co-operate with one or more computers or design apparatuses 11. Automated or computer aided drilling typically requires the use of the pre-designed drilling patterns 7, which define for each round number of drill holes, dimensions of the drill holes, direction of the drill holes, or alternatively, start and end coordinates of the drill holes, for example. Sometimes the same basic drilling pattern 7 may be repeated for several successive rounds. However, there exist relatively often manually made deviations to the planned drilling patterns, and these manually made selections require that the blasting sequence needs to be redesigned. Design work of the blasting sequence manually is time consuming and demanding work.

The round 2 is blasted by firing the charges inserted inside the drill holes 3 either manually of by means of a charging manipulator. The firing is initiated at a special location and it expands further during the available total blasting time. The drill holes 3, or actually their charges, are fired in accordance with the pre-designed blasting sequence 9, which defines firing order of the charges. Thus, the entire blast is divided into several successive smaller blasts. After an initial firing there are several time delays following the initial firing.

The blasting sequence also determines positions of the blasts and amount of the fired charges per each time delay. The blasting expands rapidly towards an outer contour of the round. The blasting forces breaks the solid rock material and move it towards available, already formed free space 12. The detached and broken material may, at least partly, fly axially 13 away from the face due to the produced gases of the detonation.

Figure 2:
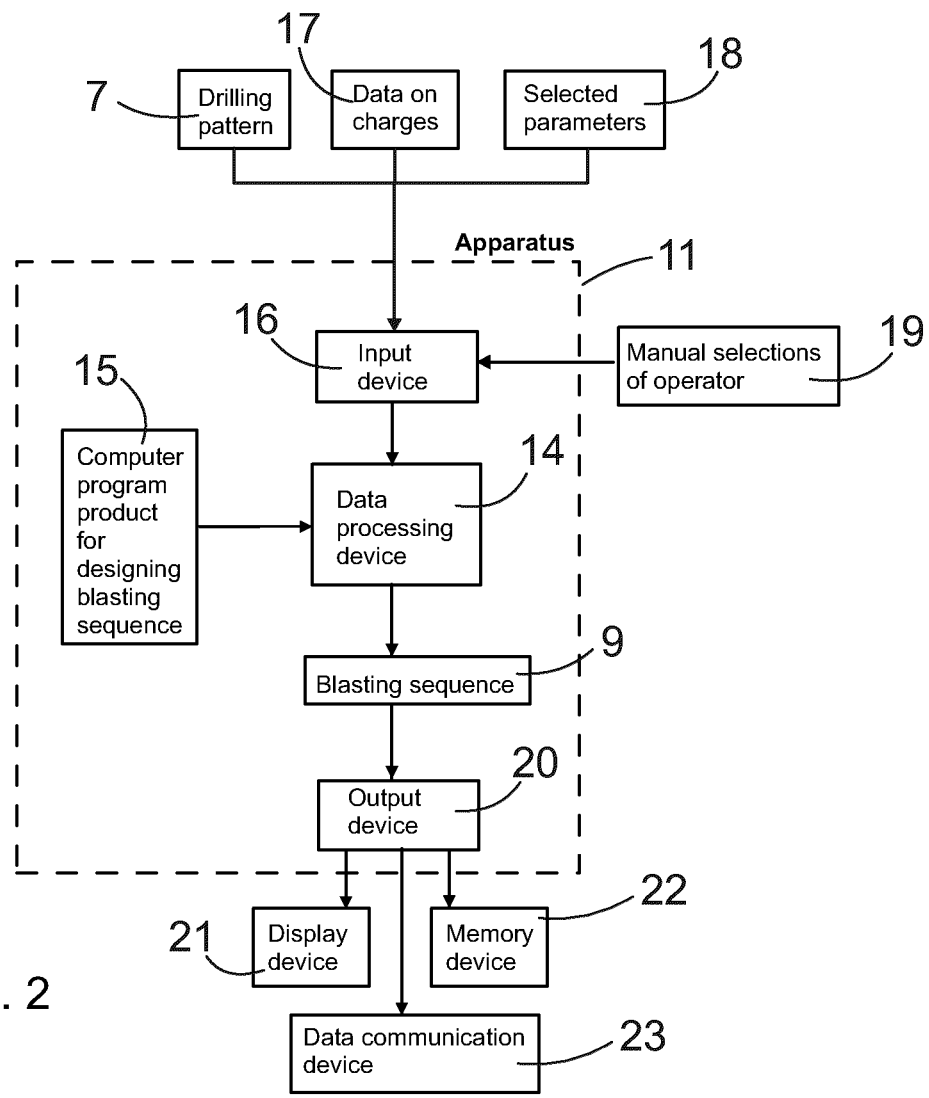
FIG. 2 is a schematic and simplified control block diagram of an apparatus for designing blasting sequences.

FIG. 2 illustrates some features and composition of the disclosed apparatus 11 configured to design the mentioned blasting sequences. The apparatus 11 comprises one or more data processing devices 14 provided with processors or corresponding devices. The processing device 14 comprises a computer program product 15, which is executed in the processor. The computer program 15 may be recorded on non-transitory computer-readable media including program instructions for implementing various operations executed by the device 14. Required data may be input to the processing device as individual data elements or may be retrieved from one or more memory devices. The apparatus 11 may comprise an input device 16 for receiving the data. The input data may comprise data on drilling patterns 7, data on charges 17 and available time delays, and also other input parameters 18, examples of which are disclosed in FIG. 3. Further, the operator may input data and make selections 19 via one or more input devices. The input device may also comprise a touch screen, a keypad, a mouse or any other suitable control device. The data may be input to the processing device as individual data elements or may be retrieved from one or more memory devices.

The processing device 14 may execute needed calculations and operations as instructed by the computer program 15 and input parameters. The apparatus 11 may transmit the results by means of an output device 20 to a display device 21, memory device 22 and data communication device 23. This way the designed blasting sequence 9 may be displayed, stored and transmitted to desired location.

When the apparatus operates in a computer aided mode, then the apparatus may make proposals for the operator on the display 21 and the operator can accept them by using the input device 16.

Figure 3:
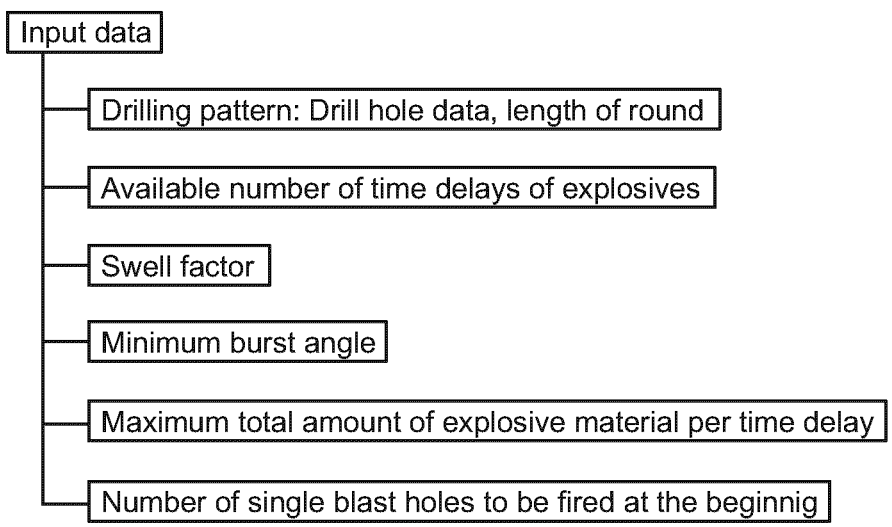
FIG. 3 is a schematic diagram showing some input data needed for the design work of the blasting sequence.

FIG. 3 discloses possible data input to the apparatus for the design of the blasting sequence. These issues have already been discussed above in this document.

Figure 4:
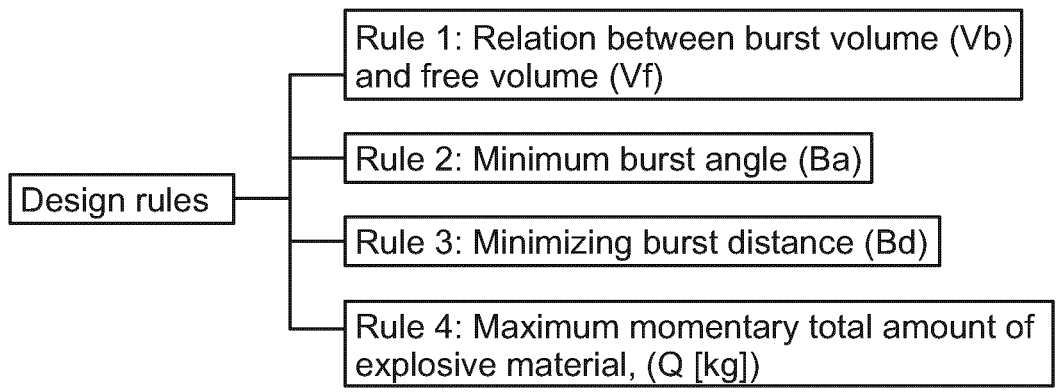
FIG. 4 is a schematic diagram showing design rules for the design work of the blasting sequence.

FIG. 4 discloses design rules which are utilized in the disclosed solution. The rules 1-4 are discussed above in this document and may be implemented and weighted in the numerical order in the design work. However, in some cases not all of them are considered, which means that rules 2-4 may be optional and different combinations are also possible.

Figure 5:
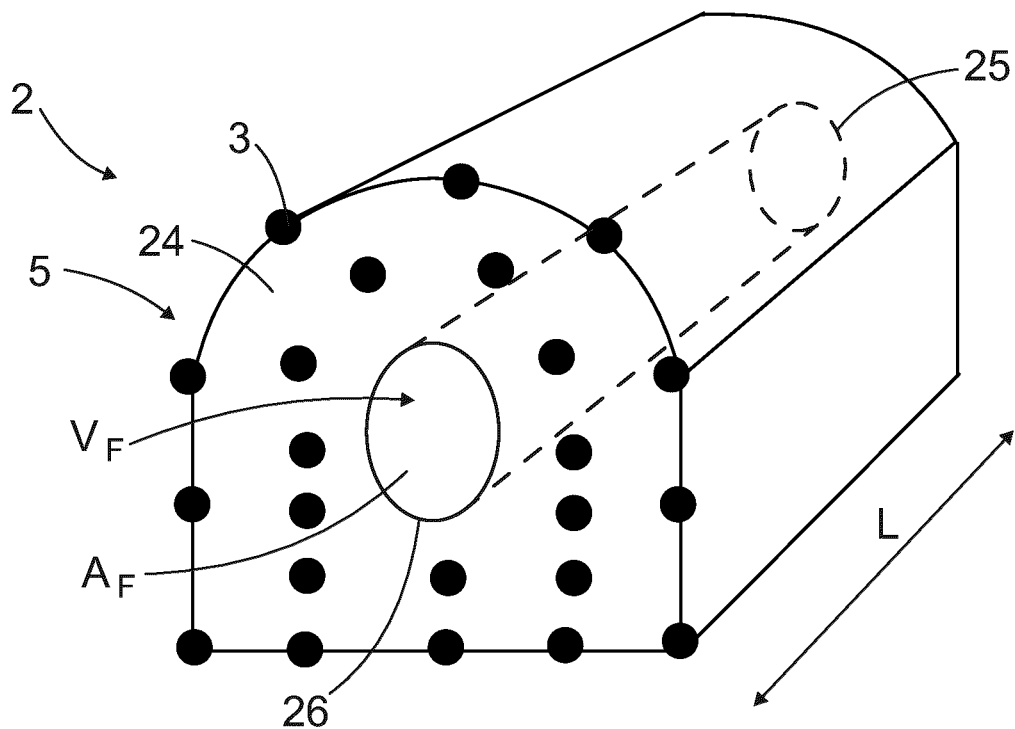
FIG. 5 is a schematic view of a round with an initially blasted free space.

FIG. 5 discloses a round 2 having a face 5, which serves as a first free surface 24. Several drill holes 3 extend from the face 5 to a bottom 25 of the round 2. The round 2 has length L. In FIG. 5 it is also illustrated in a simplified manner that some of the drill holes 3 have already been blasted and a second free surface 26 is thus created inside the round 2. The first free surface 24, second free surface 26 and the bottom define a free space 27. Volume of the free space 27 expands after each time delay when new charges of the drill holes 3 are fired. The free space 27 has free volume $V_F$, which can be defined by multiplying free surface area $A_F$ with the length L of the round 2. The free space 27 needs to be large enough to be capable of receiving rock material detached by the explosive material fired at the following time delay. Let it be further mentioned that in FIG. 5 the shape of the free space 27 is simplified for clarity reasons.

Figure 6:
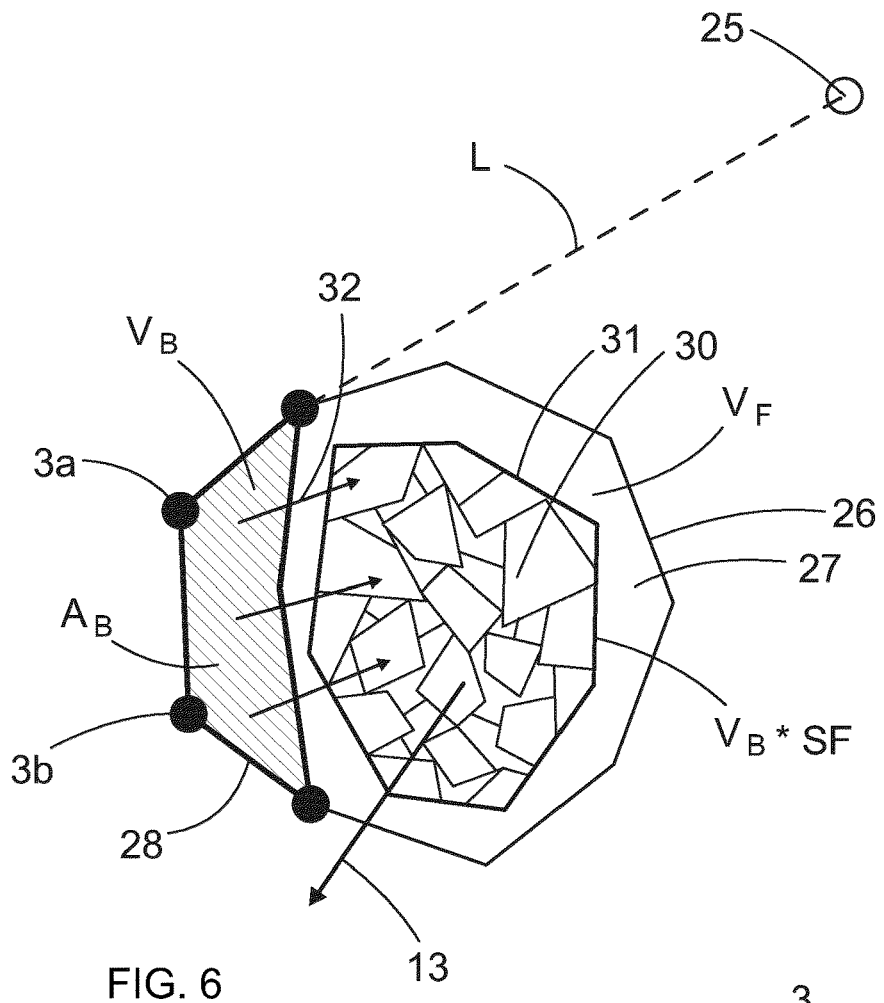
FIG. 6 is a schematic and simplified view demonstrating swelling of rock material when being blasted.

FIG. 6 discloses that when designing the blasting sequence care should be taken to ensure that rock material 28, which is planned to be detached next, is free to move towards a neighbouring free space 27. If this is not the case, then there is a risk that the rock material will be blocked and the entire blast will fail. In this example the rock material 28 to be blasted is defined by a selected drill hole set 29 comprising two new drill holes 3a, 3b, and the free space 27. The drill holes 3a, 3b of the drill hole set 29 are fired simultaneously i.e. they have the same firing number in the blasting sequence. The disclosed apparatus can calculate burst volume $V_B$ of the rock material on the basis of data on the drill holes 3 and length L of the round 2. The selected rock material 28 has blast area $A_B$, which may be substantially equal at the face and bottom of the round, or may deviate. When the drill hole set 29 is detonated, the rock material 28 becomes broken and detached. Initial volume of the rock material 28 expands because the broken material comprises blocks 30 and voids and has thereby always looser configuration compared to solid configuration. This is called swelling of the rock material. The swelled rock material 31 needs to fit inside the free space 27. Volume of the swelled rock material 31 may be 60% greater than in the solid state. Then the calculated burst volume $V_B$ is multiplied with a swell factor SF, which is in this case 1.6. The swell factor SF is one of the parameters input to the apparatus. The swell factor SF is also configurable by the operator. Magnitude of the swelling depends on the size of formed blocks 31, for example. Further, FIG. 6 illustrates by means of arrows 32 how the rock material 28 moves towards the free space 27, and that at least part of it may fly 13 towards a previously excavated round.

For clarity reasons FIGS. 7-10 disclose some examples of drill hole selection in two-dimensional presentation. In these Figures details of a drilling pattern 7 with drill holes 3 are shown.

Figure 7:
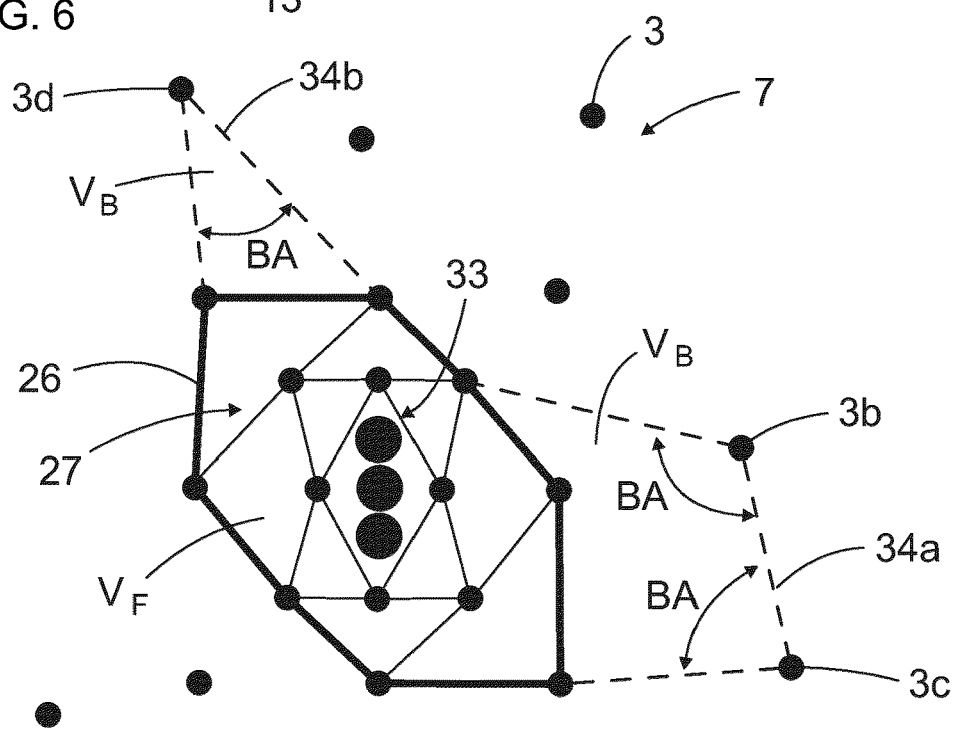
FIG. 7 is a schematic view of some non-allowable selections of drill hole sets.

FIG. 7 discloses a first free surface 26 and a free space 27 created by means of several blasts of previous time delays. The previous blasts have expanded initial space created by cut holes 33 having larger diameter compared to normal blast holes 3. The disclosed apparatus detects drill holes 3 of the drilling pattern surrounding the free space 27 and considers the design rules mentioned above when suggesting selection of one or more drill holes for the next time delay. Two optional selections or drill hole sets 34a and 34b are shown in FIG. 7. Neither of them fulfils the mentioned design rules. The first optional set 34a includes drill holes 3c and 3d, and the second optional set 34b includes one single drill hole 3e. The first optional set 34a has burst volume $V_B$, which is too large for the free volume $V_F$. The second optional set 34b has too narrow burst angle BA towards the free space. Thereby, neither of the optional sets 34a, 34b cannot be selected.

Figure 8:
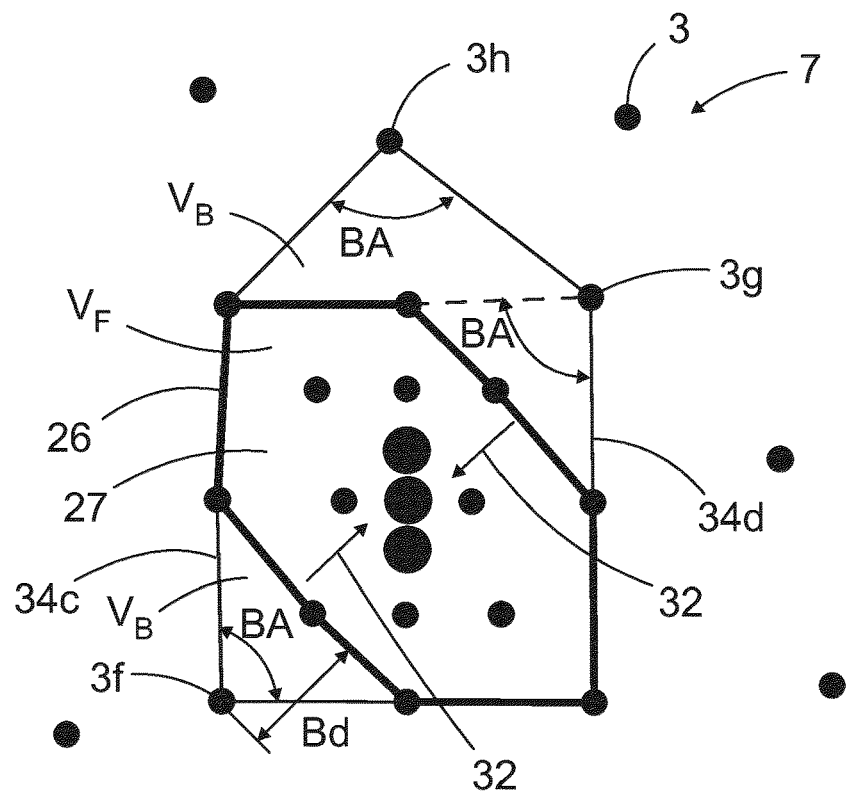
FIG. 8 is a schematic view of two opposite positioned drill hole sets having the same firing number.

FIG. 8 discloses that a drill hole set or selection 34c is allowable since its burst volume $V_B$ fits well to the free space 27 and its burst angle BA is great enough. Thereby a drill hole 3f can be selected. However, the apparatus notes that there is still room for additional rock material in the free space 27 and further that the allowed total amount of simultaneously fired explosive material does not yet limit the number of selected drill holes. Thereby, the apparatus selects also a drill hole 3g for the same time delay. Thereafter the apparatus notes that also a drill hole 3h may be included and thereby a drill hole set 34d with two drill holes 3g and 3h is created. The apparatus also examines that the blasting angles BA of the drill hole sets 34c and 34d fulfil the set criteria. When two drill hole sets are located opposite to each other, then the detached rock material collides and crushes into smaller blocks. Then the above mentioned swell factor may be minor. Arrows 32 show the movements of the blasted rock material. FIG. 8 further discloses that perpendicular distance from the selected drill holes to the free surface 26 may be calculated and based on this burst distance $B_D$ drill hole sets with shorter distances may be prioritized in case there are several alternative drill hole sets that fulfil the other design rules.

Figure 9:
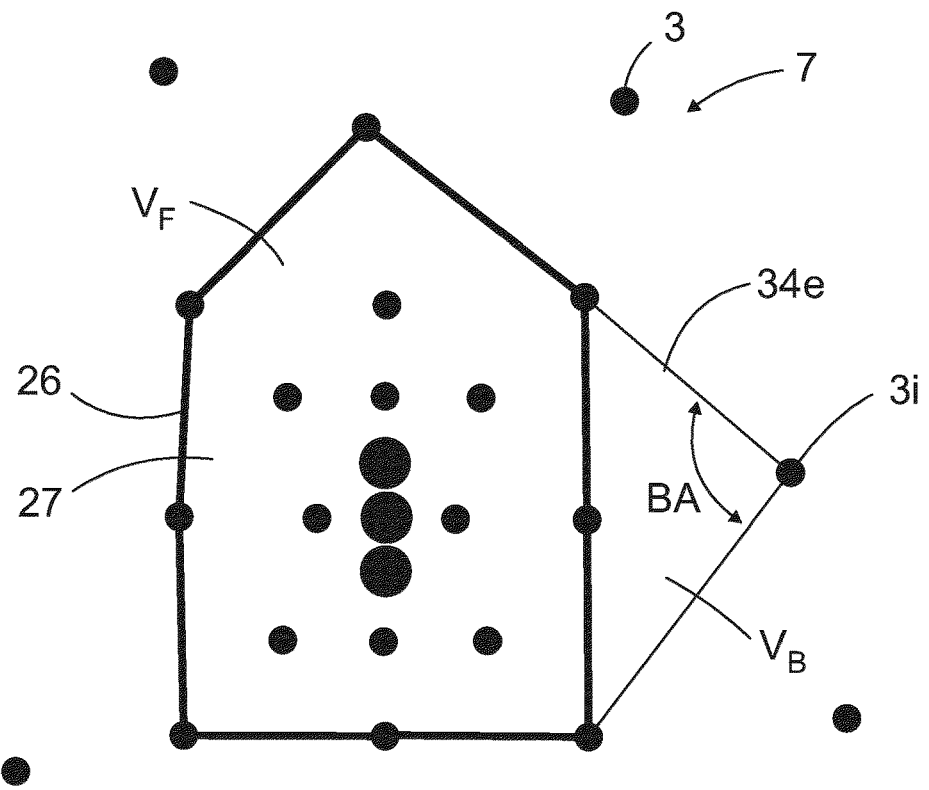
FIGS. 9 and 10 are schematic views of selected drill hole sets following the situation shown in FIG. 7.

FIG. 9 discloses that the apparatus suggests selecting a drill hole 3*i* for following time delay. Thus, the drill hole set 34*e* comprises only the drill hole 3*i*. The apparatus calculates burst volume $V_B$ for the drill hole set 34*e* and notes that it is in accordance with the rules as well as the burst angle BA.

Figure 10:
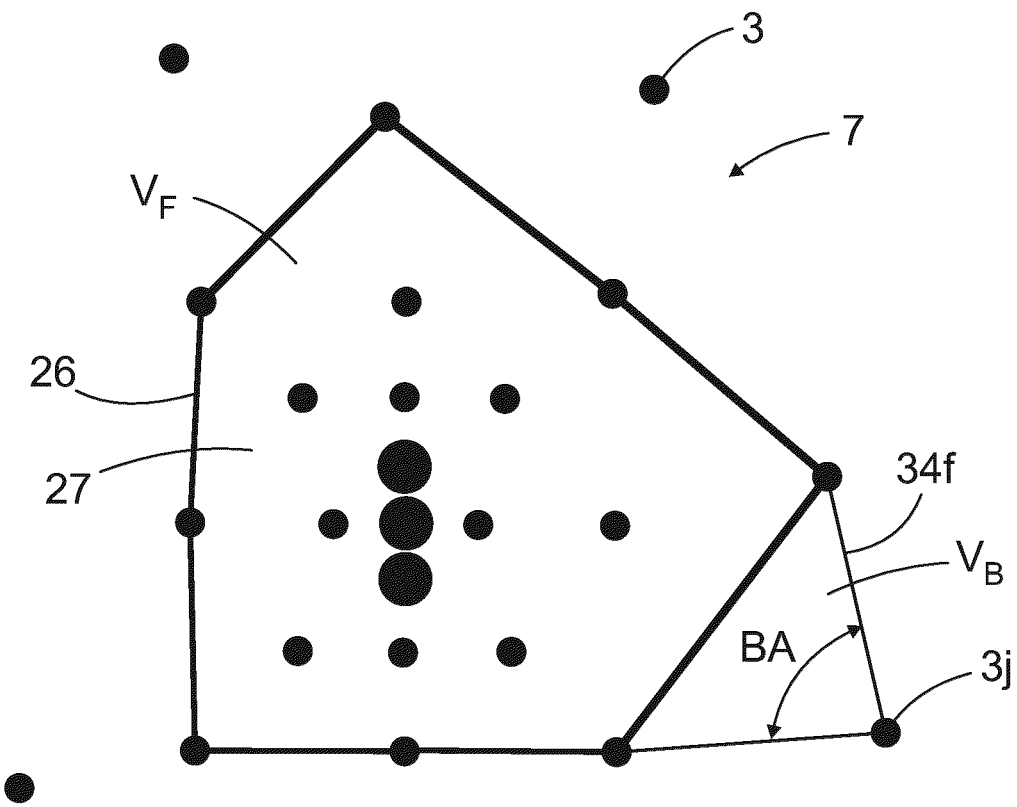

In FIG. 10 the apparatus suggests selecting a drill hole 3*j* after considering volumes and angles. After the drill hole set 34*f* is accepted by the operator, the design work continues in accordance with the same principles.

However, in addition to the volumetric consideration and to the examination of the burst angles, vibration issues and limits may limit number of the selected drill holes per each time delay. When the explosives detonate in the drill holes, high intensity waves are generated and propagated throughout the rock. These waves generally attenuate as they travel but depend on several factors such as the type of explosives, amount of explosives consumed per time delay, geological properties and the location of the round. Distance between the blasting and a sensitive target is an important factor. Environmental requirements may set limits on ground vibration levels and charge weight of explosive, especially when executing the blasting operation nearby buildings and structures. Thus, the apparatus is provided with a special design rule for taking into account data on momentary total amount of explosive material and to thereby control the vibration matters. Since the number of the time delays is typically limited, and also for the reason of efficiency, as many drill holes as possible are selected to be fired simultaneously.

Figure 11:
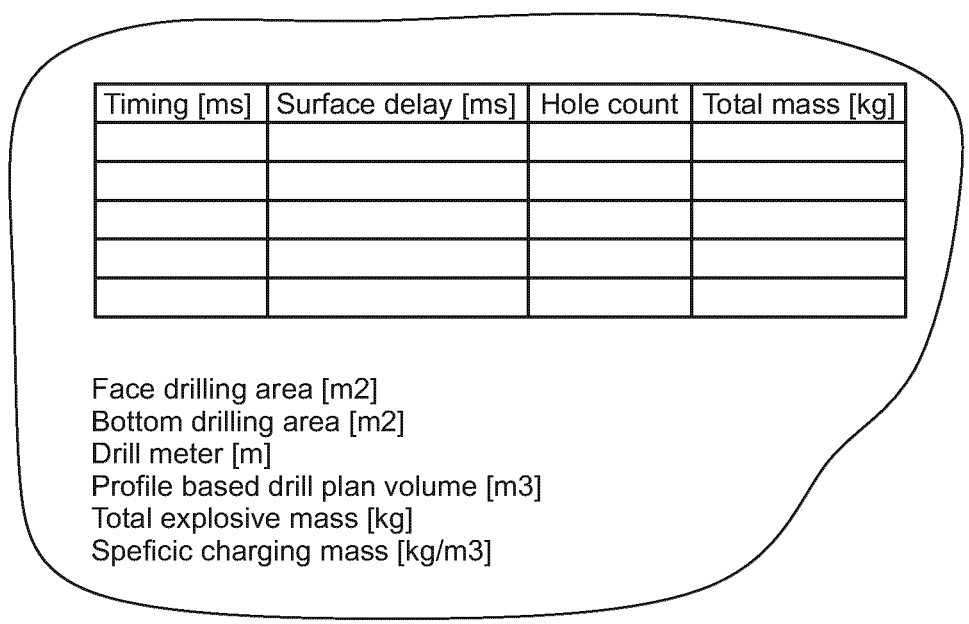
FIG. 11 is a schematic detail of numerical data shown on a display device.

FIG. 11 discloses that in addition to the above disclosed views the apparatus may display on a display device numerical data for assisting the operator.

The drawings and the related description are only intended to illustrate the idea of the invention. In its details, the invention may vary within the scope of the claims.

The invention claimed is:

1. An apparatus comprising at least one data processing device for designing blasting order of drill holes of a face drilling pattern of a round, and wherein a face of the round defines a first free surface for the blasting wherein the apparatus is provided with data on drill holes and available time delays of the blast, the apparatus is being configured to:
design a blasting sequence for the drilling pattern by dividing the blast into several successive time delays following an initial blasting of cut charges creating an initial second free surface for the blast;
allow selection of one or more drill holes for each greater time delay wherein the drill holes are surrounding previously formed second free surface defined by drill holes having shorter time delay than the examined time delay and the drill holes for the time delay;
determine burst volumes for each subsequent time delay based on input data on the selected drill hole set and data on the expanding second free surface;
determine free volume for each subsequent time delay, wherein the free volume is defined by the expanding second free surface and length of the round; and
multiply the determined burst volumes with an input swell factor, compare the products of the multiplications with the determined free volumes, and only allow selection of drill hole sets, wherein products of the multiplications are minor compared to the determined free volumes.

2. The apparatus as claimed in claim 1, wherein the apparatus is further configured to determine burst angles for the drill holes surrounding the second free surface, the apparatus being provided with data on minimum allowable magnitude for the burst angle, and wherein the apparatus is configured to allow only selection of drill holes having magnitude of the burst angle greater than the minimum burst angle towards the second free surface.

3. The apparatus as claimed in claim 2, wherein the apparatus is configured to allow only selection of drill holes having magnitude of the burst angle at least 55° towards the second free surface.

4. The apparatus as claimed in claim 1, wherein the apparatus is further configured to determine perpendicular distances defining burst distances between the outermost drill holes of allowable alternative at least two drill hole sets and the second free surface and is configured to prioritize one drill hole set having the shortest burst distance.

5. The apparatus as claimed in claim 1, wherein the apparatus is provided with data on charges of the drill holes and data on maximum momentary total amount of explosive material allowed to be blasted at the time delays, and the apparatus is configured to calculate total amount of explosive material of the selected drill holes of the examined time delay and is configured to limit the selection of the drill holes so that the total amount of explosive material of the drill holes is below the allowed momentary total amount of explosive material.

6. The apparatus as claimed in claim 1, wherein the apparatus is configured to operate in co-operation with an operator and is configured to provide the operator with proposals of the selected drill holes for each time delay and request acceptance from the operator for the suggested previous time delay before initiating planning subsequent time delay.

7. The apparatus as claimed in claim 1, comprising at least one display device and being configured to visualize on the at least one display device the generated blasting sequence step by step by presenting burst volumes at each time delay.

8. The apparatus as claimed in claim 1, comprising at least one display device, the apparatus being configured to:
display the drilling pattern together with the selectable drill holes on the display device;
display on the display device at the examined time delay previous second free surface defined by drill holes having shorter time delay compared to the examined time delay;
indicate the selected drill holes of the examined time delay relative to the previous second free surface; and
indicate expansion of the second free space caused by the selected drill holes of the examined time delay.

9. The apparatus as claimed in claim 1, wherein the apparatus is further configured to determine the same time delays for two separate sets of drill holes locating on opposite sides of the second free surface, whereby the defined sets are to be blasted simultaneously and the removed rock material will collide during the blast and will thereby become crushed when colliding.

10. The apparatus as claimed in claim 1, wherein the apparatus is configured to select only single drill holes for a predetermined amount of first time delays in order to ensuring adequate free volume for the blasted rock material at the beginning of the blast.

11. A method of designing blasting order of drill holes of a drilling pattern of a round, wherein a face of the round defines a first free surface for the blasting, the method comprising:

using at least one data processing device in the designing process;

receiving the drilling pattern including drill hole data;

receiving data on charges of the round, wherein the charging data includes available time delays of the blast and amount of explosive material of each drill hole;

designing a blasting sequence for the drilling pattern by dividing the blast into several successive time delays following an initial blasting of cut charges creating an initial second free surface for the blast;

selecting for each examined time delay at least one drill hole set having one or more drill holes surrounding previously formed second free surface defined by drill holes having shorter time delay than the examined time delay;

calculating burst volume of unbroken rock material at the examined time delay for the selected drill hole set;

determining volume of forthcoming blasted broken rock material by multiplying the calculated burst volume of the unbroken rock material with a swell factor input to the apparatus;

determining available free volume, which is volume defined by the second free surface and length of the round; and allowing only selection of drill holes, which at the examined time delay produce a minor volume of broken rock material compared to the determined free volume, whereby the rock material has adequate space to expand when being blasted.

12. The method as claimed in claim 11, further comprising providing proposals of the selected drill holes for each time delay by the data processing device, and requesting acceptance of an operator for each of the proposals before initiating designing of the following time delay.

13. The method as claimed in claim 11, further comprising taking into account input selections of drill holes made manually by an operator and continuing computer aided designing for the following time delays.

14. The method as claimed in claim 11, further comprising calculating total amount of explosive material of the selected drill holes of the examined time delay, and presenting the result on a display device.

15. A computer program product for designing a blasting sequence, comprising program code means configured to execute the steps and procedures of claim 1 when being run on a computer or a data processing device.

16. A computer program product for designing a blasting sequence comprising program code means configured to execute the steps of claim 11 when run on a computer or a data processing device.

* * * * *